| (12) | United States Patent<br>Utsunomiya | (10) Patent No.: US 11,249,504 B2<br>(45) Date of Patent: Feb. 15, 2022 |
|---|---|---|

(54) CURRENT GENERATION CIRCUIT

(71) Applicant: ABLIC Inc., Chiba (JP)

(72) Inventor: Fumiyasu Utsunomiya, Chiba (JP)

(73) Assignee: ABLIC INC., Chiba (JP)

( * ) Notice: Subject to any disclaimer, the term of this patent is extended or adjusted under 35 U.S.C. 154(b) by 79 days.

(21) Appl. No.: 16/795,870

(22) Filed: Feb. 20, 2020

(65) Prior Publication Data

US 2020/0272189 A1 Aug. 27, 2020

(30) Foreign Application Priority Data

Feb. 25, 2019 (JP) .............................. JP2019-031902

(51) Int. Cl.
*G05F 1/10* (2006.01)
*G05F 3/02* (2006.01)
*G05F 3/26* (2006.01)
*H03F 3/45* (2006.01)

(52) U.S. Cl.
CPC .......... *G05F 3/262* (2013.01); *H03F 3/45071* (2013.01)

(58) Field of Classification Search
CPC .......... G05F 3/262; G05F 3/242; G05F 3/205; G05F 3/247; G05F 3/245
USPC ................................. 327/543; 323/312, 315
See application file for complete search history.

(56) References Cited

U.S. PATENT DOCUMENTS

| 6,646,463 | B1 * | 11/2003 | Hariton | H03H 11/48 326/21 |
| 2003/0169099 | A1 * | 9/2003 | Fujiwara | G05F 1/467 327/543 |
| 2012/0001613 | A1 * | 1/2012 | Larsen | G05F 3/262 323/315 |
| 2012/0120987 | A1 * | 5/2012 | Torti | G01K 7/25 374/183 |
| 2012/0200283 | A1 * | 8/2012 | Socheat | G05F 1/575 323/316 |

FOREIGN PATENT DOCUMENTS

| GB | 2135846 A | * | 9/1984 | .............. H03F 3/30 |
| JP | H02-280406 A | | 11/1990 | |

* cited by examiner

*Primary Examiner* — Quan Tra
(74) *Attorney, Agent, or Firm* — Crowell & Moring LLP

(57) ABSTRACT

Provided is a current generation circuit including a first terminal to be connected to a first external circuit; a second terminal to be connected to a second external circuit; a first resistor in which a potential is generated by the first external circuit connected through the first terminal; a second resistor in which a potential is generated by the second external circuit connected through the second terminal; a first amplifier circuit including a first positive input terminal to which the potential generated in the first resistor is supplied, and a first negative input terminal to which the potential generated in the second resistor is supplied; and a first MOS transistor having a gate connected to an output terminal of the first amplifier circuit, a source connected to the first negative input terminal, and a drain connected to a first differential current terminal.

8 Claims, 7 Drawing Sheets

CURRENT GENERATION CIRCUIT

RELATED APPLICATIONS

This application claims priority to Japanese Patent Application No. 2019-031902 filed on Feb. 25, 2019, the entire content of which is incorporated herein by reference.

BACKGROUND OF THE INVENTION

1. Field of the Invention

The present invention relates to a current generation circuit configured to generate a differential current.

2. Description of the Related Art

Sensor devices each include a current difference measurement circuit configured to determine a current difference between electric currents output by sensor elements.

With this configuration, the sensor devices determine, by such a circuit configured to determine a current difference as illustrated in FIG. 5 (see Japanese Patent Application Laid-open No. Hei 02-280406, for example), a current difference of electric currents output from two sensor elements, for example, to perform sensing processing based on the current difference.

In the circuit of Japanese Patent Application Laid-open No. Hei 02-280406, a differential current which is a current difference between an electric current I1 input from a terminal 514 and an electric current I2 input from a terminal 516, is determined as an electric current I3.

That is, in the above-mentioned circuit, the electric current I3 which balances a potential difference between a potential generated in a resistor 501 by the electric current I1 and a potential generated in a resistor 502 by the electric current I2, is injected so that the electric current I3 serves as the differential current between the electric current I1 and the electric current I2.

SUMMARY OF THE INVENTION

The above-mentioned circuit of Japanese Patent Application Laid-open No. Hei 02-280406 is formed with the use of bipolar transistors, and hence a circuit configured to correct a base current which flows through a base of a bipolar transistor to offset the electric current I3, is additionally required.

Specifically, in a path of the electric current I1, in addition to the resistor 501 configured to detect the potential difference, a resistor 509, and bipolar transistors 503, 505, 507, and 511 are provided. Meanwhile, in a path of the electric current I2, in addition to the resistor 502 configured to detect the potential difference, a resistor 510, and bipolar transistors 504, 506, 508, and 512 are provided.

In order to generate the differential current accurately, it is required that the path of the electric current I1 and the path of the electric current I2 be formed so that elements forming the paths have similar characteristics.

However, in addition to variations in manufacturing process between the resistors 501 and 502, the elements in the path of the electric current I1 and the path of the electric current I2 also have variations in manufacturing process.

Therefore, the electric currents I1 and I2 supplied to the resistors 501 and 502, respectively, contain error components caused by the variations in manufacturing process of the elements in the paths.

In particular, when the variations in manufacturing process of the elements in the path of the electric current I1 and the elements in the path of the electric current I2 are generated as error components, one of which increases the electric current and the other reduces the electric current, the generated differential current contains a large error.

That is, in Japanese Patent Application Laid-open No. Hei 02-280406, the error components caused by the variations in manufacturing process of the elements in the paths are contained in the electric current I1 and the electric current I2.

Further, in Japanese Patent Application Laid-open No. Hei 02-280406, the electric current I3 is disadvantageously injected as the difference in electric current of the electric current I1 and the electric current I2 containing the error components.

Therefore, with Japanese Patent Application Laid-open No. Hei 02-280406, it is difficult to generate the differential current between the electric current I1 and the electric current I2 accurately.

The present invention has been made in view of the above-mentioned circumstances, and therefore has an object to provide a current generation circuit configured to reduce error components which are to be added to input currents and are caused by variations in manufacturing process of elements, to thereby increase accuracy of a differential current to be generated.

According to at least one embodiment of the present invention, there is provided a current generation circuit including a first terminal to be connected to a first external circuit; a second terminal to be connected to a second external circuit, a first resistor in which a potential is generated by the first external circuit connected through the first terminal; a second resistor in which a potential is generated by the second external circuit connected through the second terminal; a first amplifier circuit including a first positive input terminal to which the potential generated in the first resistor is supplied, and a first negative input terminal to which the potential generated in the second resistor is supplied; and a first MOS transistor having a gate connected to an output terminal of the first amplifier circuit, a source connected to the first negative input terminal, and a drain connected to a first differential current terminal.

According to the at least one embodiment of the present invention, the current generation circuit configured to reduce error components which are to be added to input currents and are caused by variations in manufacturing process of elements, to thereby increase accuracy of a differential current to be generated can be provided.

DETAILED DESCRIPTION OF THE PREFERRED EMBODIMENTS

First Embodiment

Figure 1:
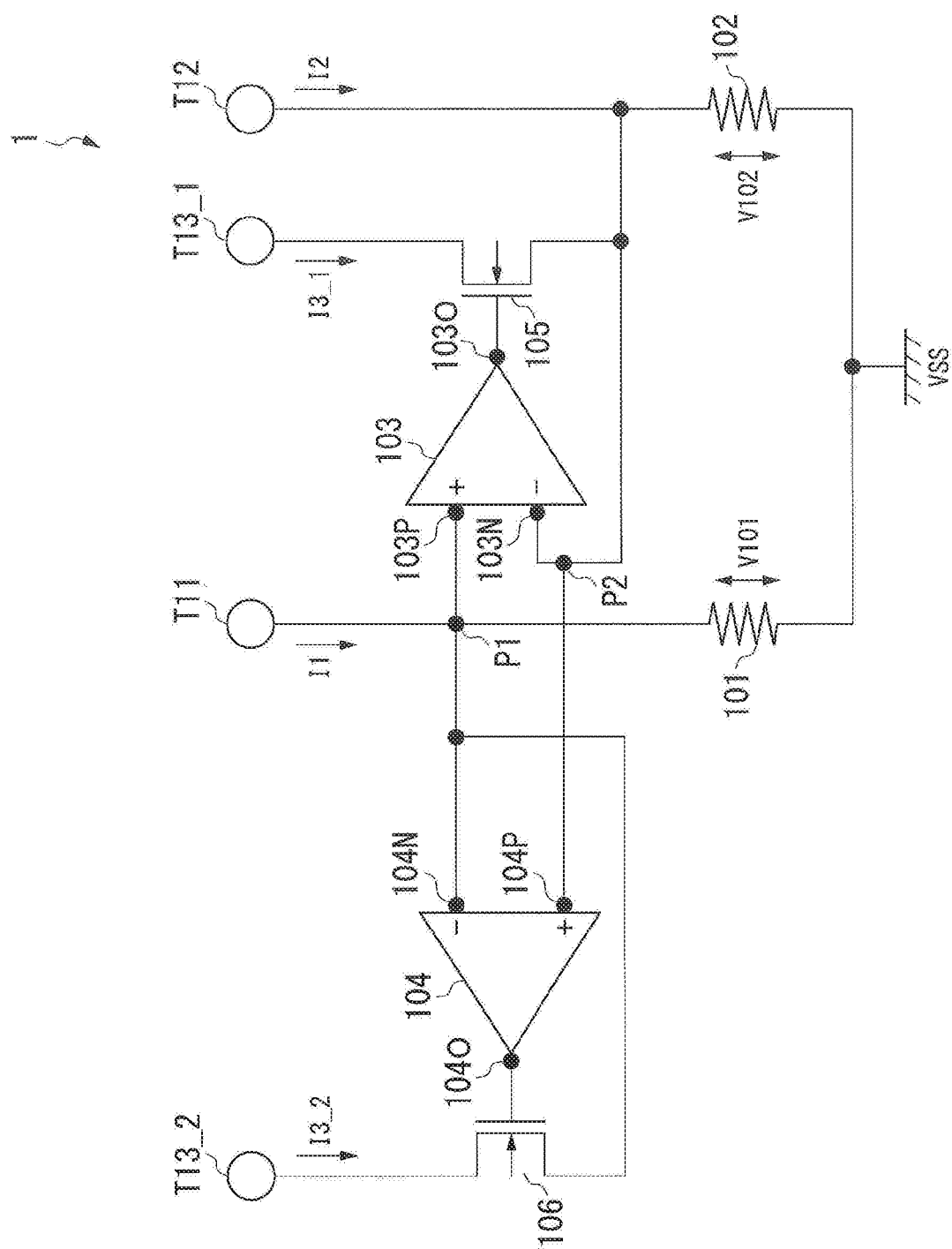
FIG. 1 is a circuit diagram for illustrating a configuration example of a current generation circuit according to a first embodiment of the present invention.

Now, with reference to the drawings, a first embodiment of the present invention is described. FIG. 1 is a circuit diagram for illustrating a configuration example of a current generation circuit according to the first embodiment of the present invention. A current generation circuit 1 includes a resistor 101 (first resistor), a resistor 102 (second resistor), an amplifier circuit 103 (first amplifier circuit), an amplifier circuit 104 (second amplifier circuit), an NMOS transistor 105 (first MOS transistor), and an NMOS transistor 106 (second MOS transistor). Each of the NMOS transistors 105 and 106 is an enhancement N-channel MOS transistor.

The resistor 101 has one end connected to a terminal T11 (first terminal), a positive input terminal 103P (first positive input terminal) of the amplifier circuit 103, a negative input terminal 104N (second negative input terminal) of the amplifier circuit 104, and a source of the NMOS transistor 106, and another end connected to a ground (VSS) terminal (VSS terminal).

The resistor 102 has one end connected to a terminal T12 (second terminal), a negative input terminal 103N (first negative input terminal) of the amplifier circuit 103, a positive input terminal 104P (second positive input terminal) of the amplifier circuit 104, and a source of the NMOS transistor 105, and another end connected to a ground (VSS) terminal.

The amplifier circuit 103 has an output terminal 103O connected to a gate of the NMOS transistor 105.

The amplifier circuit 104 has an output terminal 104O connected to a gate of the NMOS transistor 106.

The NMOS transistor 105 has a drain connected to a differential current terminal T13_1 (first differential current terminal).

The NMOS transistor 106 has a drain connected to a differential current terminal T13_2 (second differential current terminal).

In the first embodiment, the resistor 101 and the resistor 102 have the same resistance value. The NMOS transistor 105 and the NMOS transistor 106, and the amplifier circuit 103 and the amplifier circuit 104 have the same electrical characteristics.

To the terminal T11, an electric current I1 is generated by an external circuit (for example, one sensor element).

To the terminal T12, an electric current I2 is generated by an external circuit (for example, another sensor element).

To the differential current terminal T13_1, an electric current I3_1 is injected from the differential current terminal T13_1.

To the differential current terminal T13_2, an electric current I3_2 is injected from the differential current terminal T13_2.

Now, an operation of generating a differential current in the current generation circuit according to the first embodiment is described with reference to FIG. 1. In the following description, a potential at a connection point P1 is defined as a potential VP1, and a potential at a connection point P2 is defined as a potential VP2.

In a case where I1>I2

In a case where I1>I2, V101>V102, and VP1>VP2 are satisfied.

In the above-mentioned expressions, a voltage V101 is potentials generated at both ends of the resistor 101 by a voltage drop if the electric current I1 flows through the resistor 101. Similarly, a voltage V102 is potentials generated at both ends of the resistor 102 by a voltage drop if the electric current I2 flows through the resistor 102.

The potential VP1 input to the negative input terminal 104N exceeds the potential VP2 input to a positive input terminal 104P, and hence the amplifier circuit 104 outputs a voltage VSS from an output terminal 104O.

Thus, the voltage VSS is applied to the gate of the NMOS transistor 106, and hence the NMOS transistor 106 is turned off, and does not inject the electric current I3_2 (drain current) from the differential current terminal T13_2 to the resistor 101. Therefore, the voltage V101 is generated across both ends of the resistor 101, as the voltage drop by the electric current I1 flowing through the resistor 101.

Meanwhile, the potential VP1 input to the positive input terminal 103P exceeds the potential VP2 input to the negative input terminal 103N, and hence the amplifier circuit 103 outputs a voltage VCON1 from the output terminal 103O. The amplifier circuit 103 outputs the voltage VCON1 as a voltage value that is proportional to a potential difference between the potential VP1 and the potential VP2.

Then, the voltage VCON1 is applied to the gate of the NMOS transistor 105, and hence the NMOS transistor 105 injects the electric current I3_1 that is proportional to the voltage VCON1 from the differential current terminal T13_1 to the resistor 102.

Therefore, the voltage V102 is generated across both ends of the resistor 102, as the voltage drop by a combined current obtained by combining the electric current I2 and the electric current I3_1.

If the potential VP2 is the same voltage as the potential VP1, the amplifier circuit 103 outputs the voltage output from the output terminal 103O while fixing the voltage to a predetermined voltage value VCN1.

If the predetermined voltage value VCN1 is applied to the gate of the NMOS transistor 105, the electric current I3_1 flowed as a drain current from the differential current terminal T13_1 by the NMOS transistor 105 is a differential current of the electric current I2 with respect to the electric current I1.

In a case where I1<I2

In a case where I1<I2, V101<V102, and VP1<VP2 are satisfied.

The potential VP2 input to the negative input terminal 103N exceeds the potential VP1 input to the positive input terminal 103P, and hence the amplifier circuit 103 outputs a voltage VSS from the output terminal 103O.

Thus, the voltage VSS is applied to the gate of the NMOS transistor 105, and hence the NMOS transistor 105 is turned off, and does not inject the electric current I3_1 (drain current) from the differential current terminal T13_1 to the resistor 102. Therefore, the voltage V102 is generated across both ends of the resistor 102, as the voltage drop by the electric current I2 flowing through the resistor 102.

Meanwhile, because the potential VP2 input to the positive input terminal 104P exceeds the potential VP1 input to the negative input terminal 104N, the amplifier circuit 104 outputs a voltage VCON2 from the output terminal 104O. The amplifier circuit 104 outputs the voltage VCON2 as a voltage value that is proportional to a potential difference between the potential VP2 and the potential VP1.

Then, the voltage VCON2 is applied to the gate of the NMOS transistor 106, and hence the NMOS transistor 106 injects the electric current I3_2 that is proportional to the voltage VCON2 from the differential current terminal T13_2 to the resistor 101.

Therefore, the voltage V101 is generated across both ends of the resistor 101, as the voltage drop by a combined current obtained by combining the electric current I1 and the electric current I3_2.

If the potential VP1 is increased to become the same voltage as the potential VP2, the amplifier circuit 104 outputs the voltage output from the output terminal 104O while fixing the voltage to a predetermined voltage value VCN2.

If the predetermined voltage value VCN2 is applied to the gate of the NMOS transistor 106, the electric current I3_2 flowed as a drain current from the differential current terminal T13_2 by the NMOS transistor 106 is a differential current of the electric current I1 with respect to the electric current I2.

As described above, in the first embodiment, in the case where I1>I2, the differential current between the electric current I1 and the electric current I2 flows through the differential current terminal T13_1, and in contrast, in the case where I1<I2, the differential current between the electric current I2 and the electric current I1 flows through the differential current terminal T13_2.

In the first embodiment, the current value of the current to be injected is controlled by applying the output voltage of the amplifier circuits to the gates of the NMOS transistors. Therefore, it is not required to provide a circuit (a plurality of elements, for example, the bipolar transistors) configured to correct a base current which is added to the input current to become an error component, as opposed to the case where bipolar transistors are used.

Therefore, according to the first embodiment, the only error in determining a differential current is a deviation in resistance values caused by variations in manufacturing process of the resistor 101 and the resistor 102, and the differential current between the electric currents I1 and I2 can be generated with high accuracy.

Figure 2A:
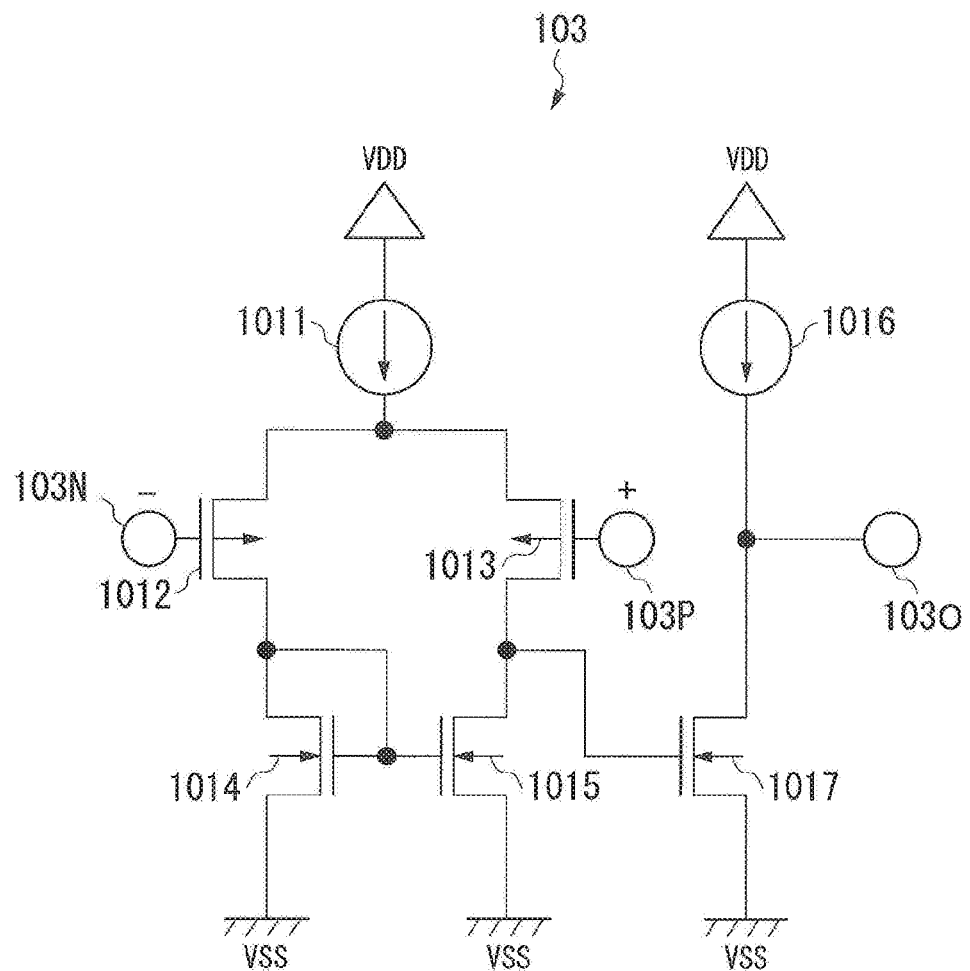
FIGS. 2A and 2B are a circuit diagram for illustrating a configuration example of an amplifier circuit in the first embodiment of the present invention.
Figure 2B:
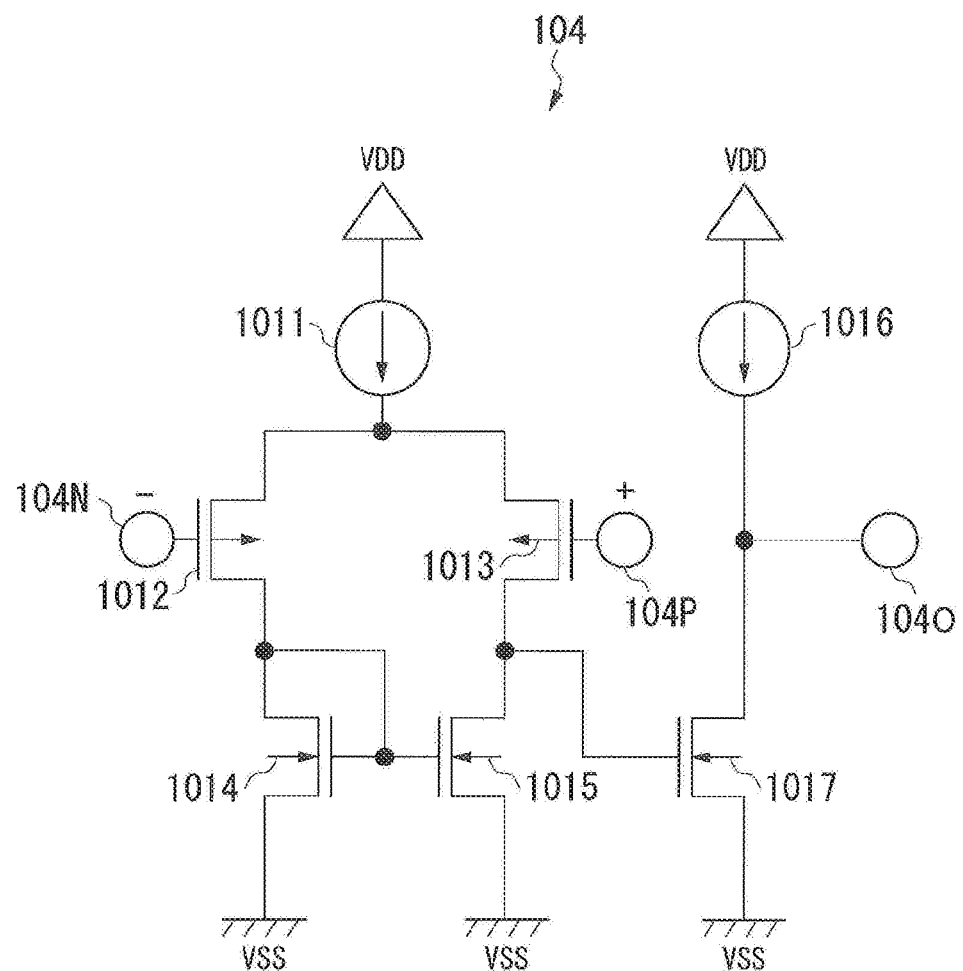

FIGS. 2A and 2B are a circuit diagram for illustrating a configuration example of an amplifier circuit in the first embodiment of the present invention. Each of the amplifier circuit 103 illustrated in FIG. 2A and the amplifier circuit 104 illustrated in FIG. 2B is an example of the amplifier circuit in the first embodiment. The amplifier circuit 104 includes the same components as those of the amplifier circuit 103. Thus, in view of omitting the duplicate explanation as to the amplifier circuit in the first embodiment, the explanation of the amplifier circuit 103 will be described in this embodiment. The amplifier circuit 103 (104) includes a constant current source 1011, PMOS transistors 1012 and 1013, NMOS transistors 1014, 1015, and 1017, and a constant current source 1016. The PMOS transistors 1012 and 1013 are enhancement P-channel MOS transistors. The NMOS transistors 1014, 1015, and 1017 are enhancement N-channel MOS transistors.

The PMOS transistor 1012 has a source connected to a power supply (VDD) terminal via the constant current source 1011, a gate connected to the negative input terminal 103N (104N) of the amplifier circuit 103 (104), and a drain connected to a drain and a gate of the NMOS transistor 1014, and a gate of the NMOS transistor 1015.

The PMOS transistor 1013 has a source connected to a power supply (VDD) terminal via the constant current source 1011, a gate connected to the positive input terminal 103P (104P) of the amplifier circuit 103 (104), and a drain connected to a drain of the NMOS transistor 1015 and a gate of the NMOS transistor 1017.

The NMOS transistor 1014 has a drain connected to a gate thereof and the gate of the NMOS transistor 1015, and a source connected to a ground (VSS) terminal.

The NMOS transistor 1015 has a drain connected to the gate of the NMOS transistor 1017, and a source connected to a ground (VSS) terminal.

The NMOS transistors 1014 and 1015 form a current mirror circuit.

The NMOS transistor 1017 has a drain connected to a power supply (VDD) terminal via the constant current source 1016 and to the output terminal 103O (104O) of the amplifier circuit 103 (104), and a source connected to a ground (VSS) terminal.

As described above, in the amplifier circuit 103, the terminal TI1 is connected to the gate of the PMOS transistor 1013 as the positive input terminal 103P, and the terminal T12 is connected to the gate of the PMOS transistor 1012 as the negative input terminal 103N. Therefore, no electric current flows into the gates of the PMOS transistors 1012 and 1013, and a predetermined voltage VCON is output from the output terminal 103O without affecting the electric currents I1 and I2.

Further, with the output terminal 103O being connected to the gate of the NMOS transistor 105, no electric current flows from the output terminal 103O to the outside, and the predetermined voltage VCON can be output with high accuracy. Furthermore, in the case of the amplifier circuit 104, the electric currents I1 and I2 are not affected as in the case of the amplifier circuit 103.

Therefore, according to the first embodiment, with the use of the amplifier circuit 103 formed of the MOS transistors, the differential current between the electric currents I1 and I2 can be generated with high accuracy.

Further, in a case where it is not required to detect which of the electric currents I1 and I2 is larger than the other, and the differential current between the electric currents I1 and I2, that is, a differential current as an absolute value is to be detected, there may be employed a configuration in which the differential current terminals T13_1 and T13_2 are integrated into a differential current terminal T13. In this case, to the differential current terminal T13, the drains of the NMOS transistors 105 and 106 are connected.

In this configuration, in a case where it is an objective to reduce the number of terminals, and it is required to detect which of the electric currents I1 and I2 is larger, it is possible to detect which of the electric currents I1 and I2 is larger than the other based on the voltages of the output terminals of the amplifier circuits 103 and 104.

Further, under a condition in which, of two electric currents to determine a differential current, it is determined that one electric current is larger than the other, in a case where the differential current of the two electric currents is to be generated, the electric current with the larger current value is input as the electric current I1 to the terminal T11, and the electric current with the smaller current value is input as the electric current I2 to the terminal T12.

Under this condition, it is not required to provide the amplifier circuit 104, the NMOS transistor 106, and the differential current terminal T13_2, and the circuit can be simplified.

Second Embodiment

Figure 3:
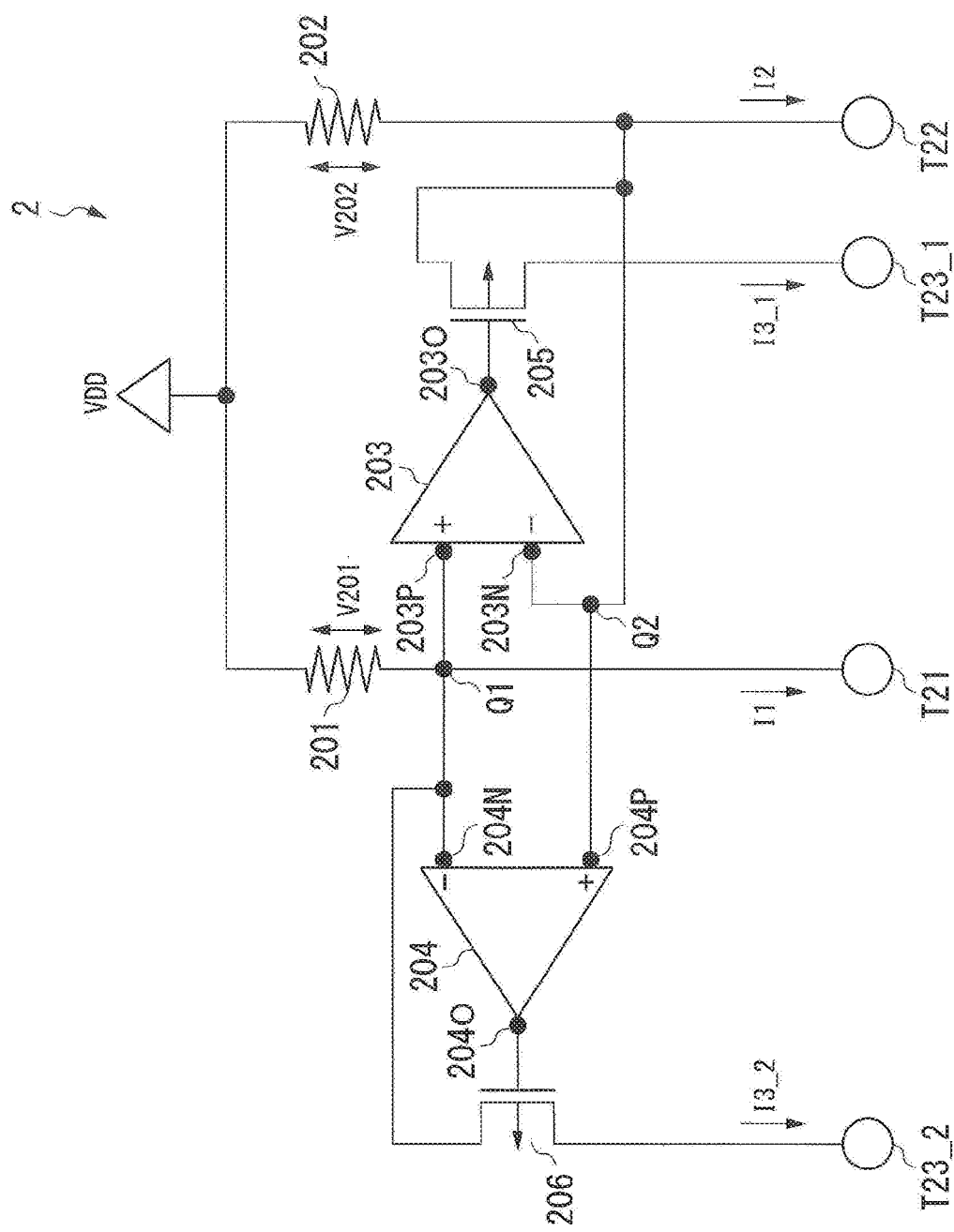
FIG. 3 is a circuit diagram for illustrating a configuration example of a current generation circuit according to a second embodiment of the present invention.

Now, with reference to the drawings, a second embodiment of the present invention is described. FIG. 3 is a circuit diagram for illustrating a configuration example of a current generation circuit according to the second embodiment of the present invention. A current generation circuit 2 includes a resistor 201 (first resistor), a resistor 202 (second resistor), an amplifier circuit 203 (first amplifier circuit), an amplifier circuit 204 (second amplifier circuit), a PMOS transistor 205 (first MOS transistor), and a PMOS transistor 206 (second MOS transistor). Each of the PMOS transistors 205 and 206 is an enhancement P-channel MOS transistor.

The resistor 201 has one end connected to a power supply (VDD) terminal (VDD terminal), and another end connected to a terminal T21 (first terminal), a positive input terminal 203P (first positive input terminal) of the amplifier circuit 203, a negative input terminal 204N (second negative input terminal) of the amplifier circuit 204, and a source of the PMOS transistor 206.

The resistor 202 has one end connected to a power supply (VDD) terminal (VDD terminal), and another end connected to a terminal T22 (second terminal), a negative input terminal 203N of the amplifier circuit 203, a positive input terminal 204P of the amplifier circuit 204, and a source of the PMOS transistor 205.

The amplifier circuit 203 has an output terminal 203O connected to a gate of the PMOS transistor 205.

The amplifier circuit 204 has an output terminal 204O connected to a gate of the PMOS transistor 206.

The PMOS transistor 205 has a drain connected to a differential current terminal T23_1 (first differential current terminal).

The PMOS transistor 206 has a drain connected to a differential current terminal T23_2 (second differential current terminal).

In the second embodiment, the resistor 201 and the resistor 202 have the same resistance value. The PMOS transistor 205 and the PMOS transistor 206, and the amplifier circuit 203 and the amplifier circuit 204 have the same electrical characteristics.

To the terminal T21, an electric current I1 is generated by an external circuit (for example, one sensor element).

To the terminal T22, an electric current I2 is generated by an external circuit (for example, another sensor element).

To the differential current terminal T23_1, an electric current I3_1 flows to the differential current terminal T23_1.

To the differential current terminal T23_2, an electric current I3_2 flows to the differential current terminal T23_2.

Now, an operation of generating a differential current in the current generation circuit according to the second embodiment is described with reference to FIG. 3. In the following description, a potential at a connection point Q1 is defined as a potential VQ1, and a potential at a connection point Q2 is defined as a potential VQ2.

In a case where I1>I2

In a case where I1>I2, V201>V202, and VQ1<VQ2 are satisfied.

The potential VQ1 input to the negative input terminal 204N falls below the potential VQ2 input to a positive input terminal 204P, and hence the amplifier circuit 204 outputs a voltage VDD from the output terminal 204O.

Thus, the voltage VDD is applied to the gate of the PMOS transistor 206, and hence the PMOS transistor 206 is turned off, and does not supply the electric current I3_2 to the differential current terminal T23_2. Therefore, the voltage V201 is generated across both ends of the resistor 201, as the voltage drop by the electric current I1 flowing through the resistor 201.

Meanwhile, the potential VQ1 input to the positive input terminal 203P falls below the potential VQ2 input to the negative input terminal 203N, and hence the amplifier circuit 203 outputs a voltage VCON3 from the output terminal 203O. The amplifier circuit 203 outputs the voltage VCON3 as a voltage value that is proportional to a potential difference between the potential VQ1 and the potential VQ2.

Then, the voltage VCON3 is applied to the gate of the PMOS transistor 205, and hence the PMOS transistor 205 supplies the electric current I3_1 that is proportional to the voltage VCON3 to the differential current terminal T23_1.

Therefore, the voltage V202 is generated across both ends of the resistor 202, as the voltage drop by a combined current obtained by combining the electric current I2 and the electric current I3_1.

If the voltage V202 is increased, and the potential VQ2 is reduced to become the same voltage as the potential VQ1, the amplifier circuit 203 outputs the voltage output from an output terminal 203O while fixing the voltage to a predetermined voltage value VCN3.

If the predetermined voltage value VCN3 is applied to the gate of the PMOS transistor 205, the electric current I3_1 supplied as a drain current to the differential current terminal T23_1 by the PMOS transistor 205 is a differential current of the electric current I2 with respect to the electric current I1.

In a case where I1<I2

In a case where I1<I2, V101<V102, and VQ1>VQ2 are satisfied.

The potential VQ2 input to the negative input terminal 203N falls below the potential VQ1 input to a positive input terminal 203P, and hence the amplifier circuit 203 outputs a voltage VDD from the output terminal 203O.

Thus, the voltage VDD is applied to the gate of the PMOS transistor 205, and hence the PMOS transistor 205 is turned off, and does not supply the electric current I3_1 to the differential current terminal T23_1. Therefore, the voltage V202 is generated across both ends of the resistor 202, as the voltage drop by the electric current I2 flowing through the resistor 202.

Meanwhile, the potential VQ2 input to the positive input terminal 204P falls below the potential VQ1 input to the negative input terminal 204N, and hence the amplifier circuit 204 outputs a voltage VCON4 from the output terminal 204O. The amplifier circuit 204 outputs the voltage VCON4 as a voltage value that is proportional to a potential difference between the potential VQ2 and the potential VQ1.

Then, the voltage VCON4 is applied to the gate of the PMOS transistor 206, and hence the PMOS transistor 206 supplies the electric current I3_2 that is proportional to the voltage VCON4 to the differential current terminal T23_2.

Therefore, the voltage V201 is generated across both ends of the resistor 201, as the voltage drop by a combined current obtained by combining the electric current I1 and the electric current I3_2.

If the voltage V201 is increased, and the potential VQ1 is reduced to become the same voltage as the potential VQ2, the amplifier circuit 204 outputs the voltage output from an output terminal 204O while fixing the voltage to a predetermined voltage value VCN4.

If the predetermined voltage value VCN4 is applied to the gate of the PMOS transistor 206, the electric current I3_2 supplied as a drain current to the differential current terminal T232 by the PMOS transistor 206 is a differential current of the electric current I1 with respect to the electric current I2.

As described above, in the second embodiment, in the case where I1>I2, the differential current between the electric current I1 and the electric current I2 flows through the differential current terminal T23_1, and in contrast, in the case where I1<I2, the differential current between the electric current I2 and the electric current I1 flows through the differential current terminal T23_2.

In the second embodiment, similarly to the first embodiment, the current value is controlled by applying the output voltage of the amplifier circuits to the gates of the PMOS transistors. Therefore, it is not required to provide a circuit (a plurality of elements, for example, the bipolar transistors) configured to correct a base current which is added to the current to become an error component, as opposed to the case where bipolar transistors are used.

Therefore, according to the second embodiment, the only error in determining a differential current is a deviation in resistance values caused by variations in manufacturing process of the resistor 201 and the resistor 202, and the differential current between the electric currents I1 and I2 can be generated with high accuracy.

Figure 4A:
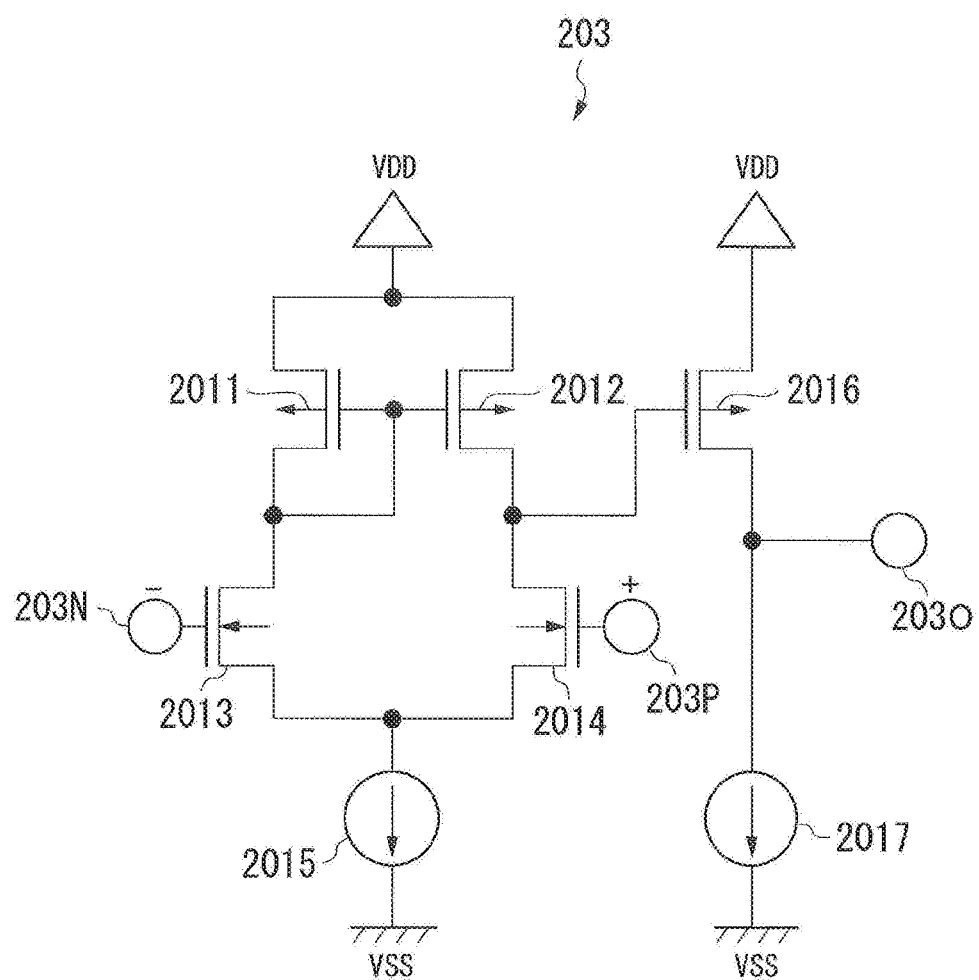
FIGS. 4A and 4B are a circuit diagram for illustrating a configuration example of an amplifier circuit in the second embodiment of the present invention.
Figure 4B:
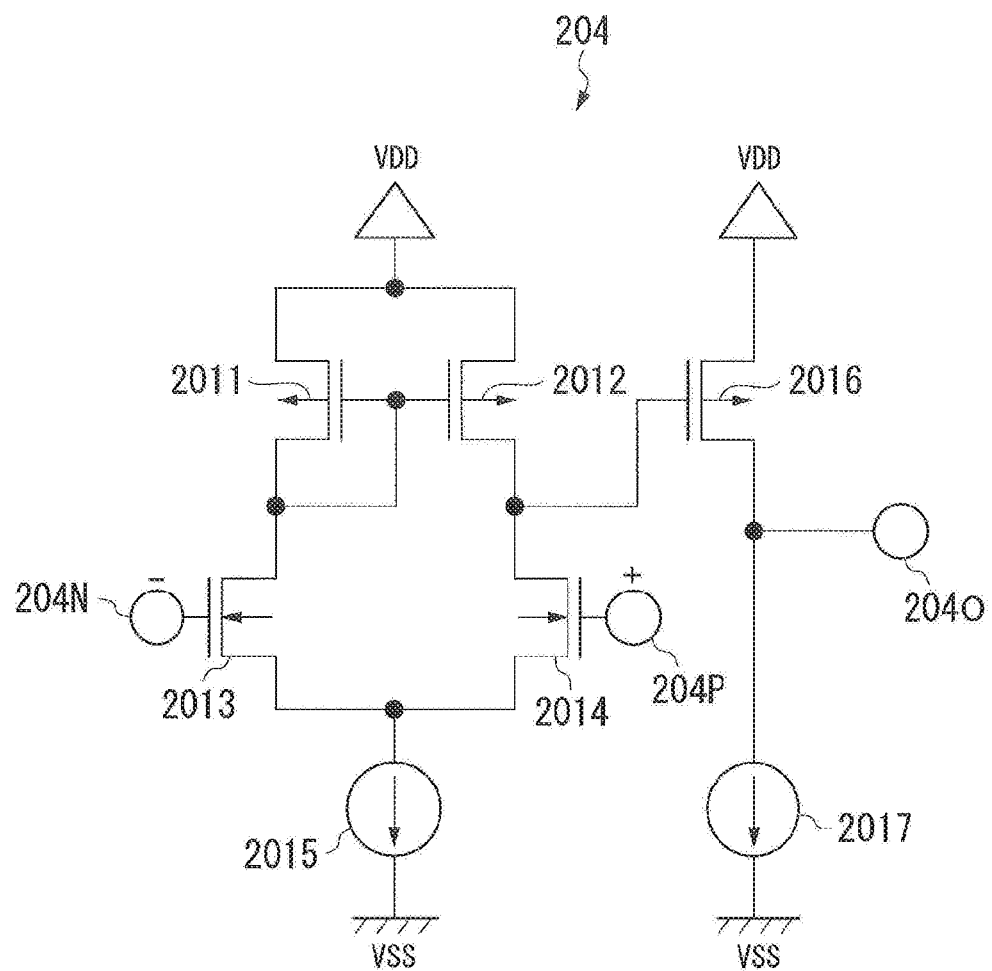
Figure 5:
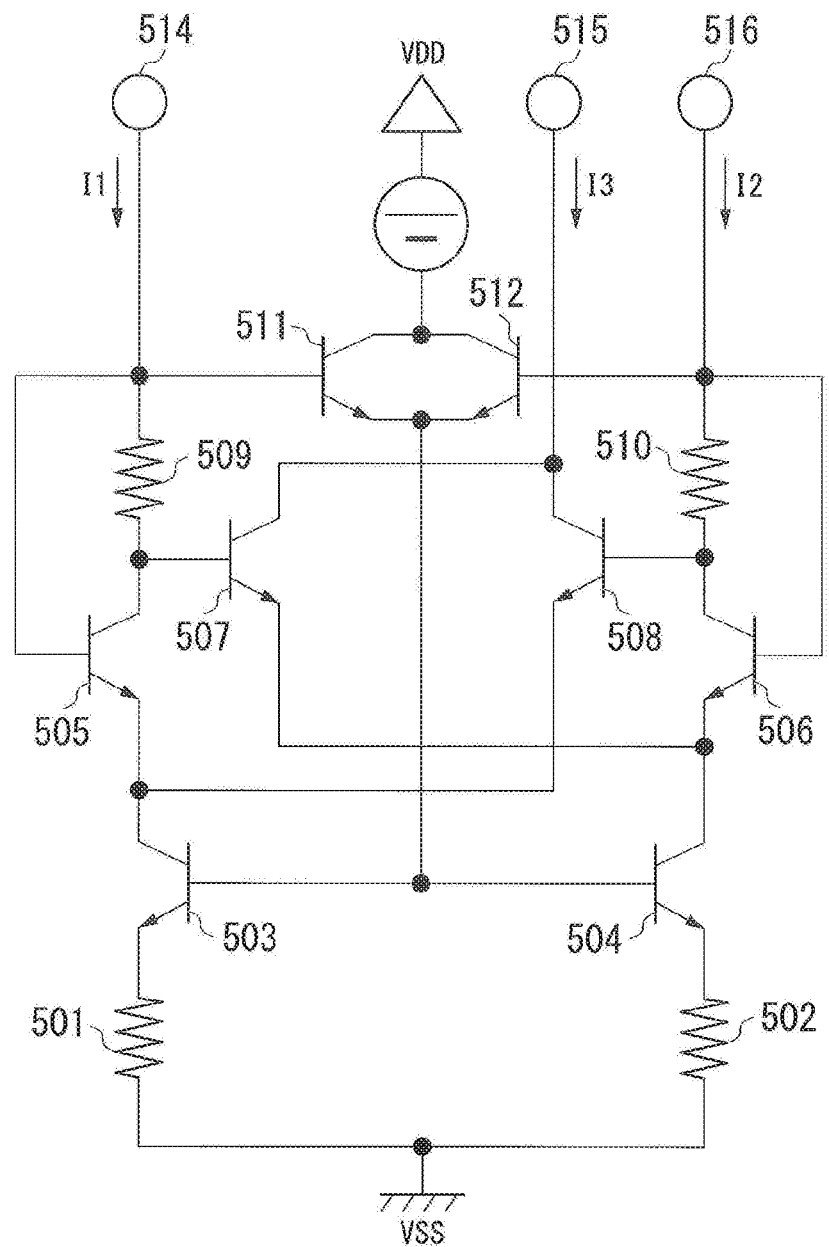
FIG. 5 is a circuit diagram for illustrating a configuration of a prior art circuit configured to determine a differential current.

FIGS. 4A and 4B are a circuit diagram for illustrating a configuration example of an amplifier circuit in the second embodiment of the present invention. Each of the amplifier circuit 203 illustrated in FIG. 4A and the amplifier circuit 204 illustrated in FIG. 4B is an example of the amplifier circuit in the second embodiment. The amplifier circuit 204 includes the same components as those of the amplifier circuit 203. Thus, in view of omitting the duplicate explanation as to the amplifier circuit in the second embodiment, the explanation of the amplifier circuit 203 will be described in this embodiment. The amplifier circuit 203 (204) includes PMOS transistors 2011, 2012, and 2016, NMOS transistors 2013 and 2014, and constant current sources 2015 and 2017. The PMOS transistors 2011, 2012, and 2016 are enhancement P-channel MOS transistors. The NMOS transistors 2013 and 2014 are enhancement N-channel MOS transistors.

The PMOS transistor 2011 has a source connected to a power supply (VDD) terminal, a gate connected to a drain thereof and a gate of the PMOS transistor 2012, and a drain connected to a drain of the NMOS transistor 2013.

The PMOS transistor 2012 has a source connected to a power supply (VDD) terminal and a drain connected to a drain of the NMOS transistor 2014 and a gate of the PMOS transistor 2016.

The PMOS transistors 2011 and 2012 form a current mirror circuit.

The NMOS transistor 2013 has a gate connected to the negative input terminal 203N (204N) of the amplifier circuit 203 (204), and a source connected to a ground (VSS) terminal via the constant current source 2015.

The NMOS transistor 2014 has a gate connected to the positive input terminal 203P (204P) of the amplifier circuit 203 (204), and a source connected to a ground (VSS) terminal via the constant current source 2015.

The PMOS transistor 2016 has a source connected to a power supply (VDD) terminal, and a drain connected to a ground (VSS) terminal via a constant current source 2017 and to the output terminal 203O (204O) of the amplifier circuit 203 (204).

As described above, in the amplifier circuit 203, the terminal T21 is connected to the gate of the NMOS transistor 2014 as the positive input terminal 203P, and the terminal T22 is connected to the gate of the NMOS transistor 2013 as the negative input terminal 203N. Therefore, no electric current flows into the gates of the NMOS transistors 2013 and 2014, and a predetermined voltage VCON is output from the output terminal 203O without affecting the electric currents I1 and I2.

Further, with the output terminal 203O being connected to the gate of the PMOS transistor 205, no electric current flows from the output terminal 203O to the outside, and the predetermined voltage VCON can be output with high accuracy. Furthermore, in the case of the amplifier circuit 204, the electric currents I1 and I2 are not affected as in the case of the amplifier circuit 203.

Therefore, according to the second embodiment, with the use of the amplifier circuit 203 formed of the MOS transistors, the differential current between the electric currents I1 and I2 can be generated with high accuracy.

Further, in a case where it is not required to detect which of the electric currents I1 and I2 is larger than the other, and the differential current between the electric currents I1 and I2, that is, a differential current as an absolute value is to be detected, there may be employed a configuration in which the differential current terminals T23_1 and T23_2 are integrated into a differential current terminal T23. In this case, to the differential current terminal T23, the drains of the PMOS transistors 205 and 206 are connected.

In this configuration, in a case where it is an objective to reduce the number of terminals, and it is required to detect which of the electric currents I1 and I2 is larger, it is possible to detect which of the electric currents I1 and I2 is larger than the other based on the voltages of the output terminals of the amplifier circuits 203 and 204.

Further, under a condition in which, of two electric currents to determine a differential current, it is determined that one electric current is larger than the other, in a case where the differential current of the two electric currents is to be generated, the electric current with the larger current value is input as the electric current I1 to the terminal T21, and the electric current with the smaller current value is input as the electric current I2 to the terminal T22.

Under this condition, it is not required to provide the amplifier circuit 204, the PMOS transistor 206, and the differential current terminal T23_2, and the circuit can be simplified.

Although the embodiments of the present invention have been described in detail with reference to the drawings, the specific configurations are not limited to those of the embodiments, and the present invention also encompasses design modifications and the like without departing from the gist of the present invention.

What is claimed is:
1. A current generation circuit, comprising:
a first terminal to be connected to a first external circuit;
a second terminal to be connected to a second external circuit;
a first resistor in which a potential is generated by the first external circuit connected through the first terminal;
a second resistor in which a potential is generated by the second external circuit connected through the second terminal;
a first amplifier circuit including a first positive input terminal to which the potential generated in the first resistor is supplied, and a first negative input terminal to which the potential generated in the second resistor is supplied;
a first MOS transistor having a gate connected to an output terminal of the first amplifier circuit, a source connected to the first negative input terminal, and a drain connected to a first differential current terminal;
a second amplifier circuit having a second negative input terminal to which the potential generated in the first resistor is supplied, and a second positive input terminal to which the potential generated in the second resistor is supplied; and a second MOS transistor having a gate connected to an output terminal of the second amplifier circuit, a source connected to the second negative input terminal, and a drain connected to a second differential current terminal.

2. The current generation circuit according to claim 1, further comprising a third terminal having a predetermined potential, wherein the first resistor has a first end connected to a first end of the second resistor and the third terminal, and a second end connected to the first positive input terminal, and wherein the second resistor has a second end connected to the first negative input terminal.

3. The current generation circuit according to claim 2, wherein the first MOS transistor is an N-channel MOS transistor.

4. The current generation circuit according to claim 2, wherein the first MOS transistor is a P-channel MOS transistor.

5. The current generation circuit according to claim 2, wherein the third terminal is a VSS terminal.

6. The current generation circuit according to claim 2, wherein the third terminal is a VDD terminal.

7. The current generation circuit according to claim 1, wherein the first amplifier circuit includes second and third MOS transistors each having a gate, and wherein the first positive input terminal is configured by the gate of the second MOS transistor, and the first negative input terminal is configured by the gate of the third MOS transistor.

8. The current generation circuit according to claim 1, wherein the first amplifier circuit includes third and fourth MOS transistors each having a gate, and the second amplifier circuit includes fifth and sixth MOS transistors each having a gate, wherein the first positive input terminal is configured by the gate of the third MOS transistor, and the first negative input terminal is configured by the gate of the fourth MOS transistor, and wherein the second positive input terminal is configured by the gate of the fifth MOS transistor, and the second negative input terminal is configured by the gate of the sixth MOS transistor.

* * * * *